(12) United States Patent
Micheloni et al.

(10) Patent No.: US 9,235,467 B2
(45) Date of Patent: Jan. 12, 2016

(54) SYSTEM AND METHOD WITH REFERENCE VOLTAGE PARTITIONING FOR LOW DENSITY PARITY CHECK DECODING

(71) Applicant: PMC-SIERRA US, INC., Sunnyvale, CA (US)

(72) Inventors: Rino Micheloni, Turate (IT); Alessia Marelli, Dalmine (IT); Peter Z. Onufryk, Flanders, NJ (US)

(73) Assignee: PMC-SIERRA US, INC., Sunnyvale, CA (US)

( * ) Notice: Subject to any disclaimer, the term of this patent is extended or adjusted under 35 U.S.C. 154(b) by 95 days.

(21) Appl. No.: 14/165,135

(22) Filed: Jan. 27, 2014

(65) Prior Publication Data

US 2014/0281823 A1 Sep. 18, 2014

Related U.S. Application Data

(60) Provisional application No. 61/792,591, filed on Mar. 15, 2013.

(51) Int. Cl.
  *G06F 11/10* (2006.01)
  *H03M 13/11* (2006.01)
  *H03M 13/37* (2006.01)

(52) U.S. Cl.
  CPC ....... *G06F 11/1012* (2013.01); *H03M 13/1111* (2013.01); *H03M 13/3723* (2013.01)

(58) Field of Classification Search
  CPC .......... G06F 11/1068; G06F 11/1012; H03M 13/1111; H03M 13/1102; H03M 13/2927; H03M 13/00; H03M 13/1105; H03M 13/45; H03M 13/3723; H03M 13/2951

USPC ......................................................... 714/773
See application file for complete search history.

(56) References Cited

U.S. PATENT DOCUMENTS

| | | |
|---|---|---|
| 5,732,092 A | 3/1998 | Shinohara |
| 6,115,788 A | 9/2000 | Thowe |
| 6,539,515 B1 | 3/2003 | Gong |
| 6,934,804 B2 | 8/2005 | Hashemi |
| 6,976,194 B2 | 12/2005 | Cypher |
| 6,976,197 B2 | 12/2005 | Faust et al. |
| 7,206,992 B2 | 4/2007 | Xin |
| 7,237,183 B2 | 6/2007 | Xin |
| 7,450,668 B2 * | 11/2008 | Ghosh et al. ................. 375/341 |
| 7,484,158 B2 | 1/2009 | Sharon et al. |
| 7,937,641 B2 | 5/2011 | Amidi |
| 7,958,430 B1 | 6/2011 | Kolokowsky et al. |
| 7,975,193 B2 | 7/2011 | Johnson |

(Continued)

*Primary Examiner* — James C Kerveros
(74) *Attorney, Agent, or Firm* — Kenneth Glass; Molly Sauter; Glass & Associates

(57) ABSTRACT

A nonvolatile memory storage controller for delivering log likelihood ratios (LLRs) to a low-density parity check (LDPC) decoder for use in the decoding of an LDPC encoded codeword. The controller includes partitioning circuitry for identifying a set of soft-decision reference voltages having the smallest calculated introduced error value based upon the estimated BER of the nonvolatile memory. The controller further includes read circuitry for reading an LDPC encoded codeword stored in a nonvolatile memory storage module using the set of soft-decision reference voltages having the smallest calculated LLR introduced error value to provide a plurality of soft-decision bits representative of the codeword. The controller further includes an LLR look-up table accessible by the read circuitry to provide LLRs to the LDPC decoder for the subsequent decoding of the codeword.

20 Claims, 8 Drawing Sheets

(56) References Cited

U.S. PATENT DOCUMENTS

| | | |
|---|---|---|
| 8,140,930 B1 | 3/2012 | Maru |
| 8,176,367 B2 | 5/2012 | Dreifus et al. |
| 8,219,894 B2 | 7/2012 | Au et al. |
| 8,245,112 B2 | 8/2012 | Hicken et al. |
| 8,245,117 B1 | 8/2012 | Wu |
| 8,255,770 B2 | 8/2012 | Park et al. |
| 8,261,136 B2 | 9/2012 | D'abreu et al. |
| 8,281,227 B2 | 10/2012 | Thatcher et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 * | 12/2012 | Weingarten et al. ......... 714/794 |
| 8,359,522 B2 | 1/2013 | Gunnam et al. |
| 8,392,789 B2 | 3/2013 | Biscondi et al. |
| 8,402,201 B2 | 3/2013 | Flynn et al. |
| 8,418,023 B2 | 4/2013 | Gunnam et al. |
| 8,429,497 B2 | 4/2013 | Tu et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 2003/0033567 A1 | 2/2003 | Tamura et al. |
| 2003/0104788 A1 | 6/2003 | Kim |
| 2004/0088636 A1 | 5/2004 | Cypher |
| 2004/0123230 A1 | 6/2004 | Lee et al. |
| 2004/0252791 A1 | 12/2004 | Shen et al. |
| 2005/0248999 A1 | 11/2005 | Tamura et al. |
| 2007/0050688 A1 | 3/2007 | Thayer |
| 2007/0089031 A1 | 4/2007 | Hufman et al. |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2009/0327802 A1 | 12/2009 | Fukutomi |
| 2010/0199149 A1 | 8/2010 | Weingarten |
| 2010/0211737 A1 | 8/2010 | Flynn et al. |
| 2010/0211852 A1 | 8/2010 | Lee et al. |
| 2010/0246664 A1 | 9/2010 | Citta et al. |
| 2010/0293440 A1 | 11/2010 | Thatcher |
| 2011/0072331 A1 | 3/2011 | Sakaue et al. |
| 2011/0246853 A1 | 10/2011 | Kim |
| 2011/0296084 A1 | 12/2011 | Nango |
| 2012/0051144 A1 | 3/2012 | Weingarten et al. |
| 2012/0054413 A1 | 3/2012 | Brandt |
| 2012/0311402 A1 * | 12/2012 | Tseng et al. ................. 714/763 |
| 2013/0145235 A1 * | 6/2013 | Alhussien et al. ............ 714/773 |
| 2013/0163328 A1 | 6/2013 | Karakulak et al. |
| 2014/0040704 A1 * | 2/2014 | Wu et al. ..................... 714/773 |
| 2014/0053037 A1 | 2/2014 | Wang et al. |
| 2014/0072056 A1 | 3/2014 | Fay |
| 2014/0181617 A1 * | 6/2014 | Wu et al. ..................... 714/759 |
| 2015/0149871 A1 * | 5/2015 | Chen et al. ................... 714/773 |

* cited by examiner

SYSTEM AND METHOD WITH REFERENCE VOLTAGE PARTITIONING FOR LOW DENSITY PARITY CHECK DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. Additionally, the bit error rate (BER) of the flash memory changes over the lifetime of the device. It is well known that NAND flash memory program/erase (PE) cycling gradually degrades the storage reliability of the memory device and stronger ECC techniques may be necessary over the lifetime of the device to ensure the data integrity. The lifetime of a flash block may be defined as the maximum number of P/E cycles after which the ECC in the SSD controller can no longer ensure the required storage reliability within a specific guaranteed data storage time. The gradual wear-out of the flash memory, as a result of the P/E cycling, undesirably diminishes the memory cell noise margin and increases the raw bit error rate (RBER) of the device.

One commonly employed error correction code for nonvolatile memory storage modules, such as SSDs, is the low-density parity-check (LDPC) code. An LDPC code is a linear error correcting code having a parity check matrix with a small number of nonzero elements in each row and column. Soft-decision message passing algorithms are known in the art for decoding data encoded with LDPC error correction codes, such as the sum-product algorithm (SPA) and the min-sum algorithm. These soft-decision message passing algorithms are iterative in nature and attempt to decode the encoded data by assigning probability metrics to each bit in an encoded code word. The probability metrics indicate a reliability of each bit, that is, how likely it is that the bit read from the memory is not in error. These probability metrics are commonly referred to log likelihood ratios (LLRs) in the case of LDPC decoding. These LLRs values are often stored in LLR look-up tables, which are accessible by the NAND flash controller.

NAND-based flash storage suffers from low endurance as each flash memory cell can tolerate only a limited number of program/erase (P/E) cycles. Due to the program/erase wear-out of the flash memory, the bit error rate (BER) of the memory device typically increases during its lifetime and as such, more error correction coding will be needed to guarantee the integrity of the stored data as the devices ages. It follows that the threshold voltage distribution and associated log likelihood ratios (LLRs) of the flash memory device also change over the lifetime of the device, as the LLR values are measures of the reliability of the data read from the memory storage.

To read the LDPC encoded data from the memory storage, a set of reference voltages are selected based upon the number of reads required and the number of bits used to represent the LLR value. The set of reference voltages selected determines the LLR values selected from the LLR look-up table. The accuracy of the LLR values are affected by the selection of the reference voltages used to read the memory storage. The selection of reference voltages that do not accurately represent the threshold voltage distribution of the memory storage result in the introduction or errors into the approximation of the LLR values which negatively impacts the LDPC performance. As such, it is important to select the best set of reference voltages to be used to read the LDPC encoded data from the memory module.

Accordingly, what is needed in the art is an improved system and method for decoding LDPC encoded data, wherein the best set of reference voltages are identified and used to read the LDPC encoded data and to extract the LLR values from the LLR look-up table prior to decoding of the data.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code and accessed by a nonvolatile memory storage controller. A decoder receives the LDPC encoded data stored in the nonvolatile memory storage module from the controller and attempts to decode and recover the data.

A method of providing log likelihood ratios (LLRs) to a low-density parity check (LDPC) decoder in a nonvolatile memory storage module, including identifying an estimated bit-error-rate (BER) for the nonvolatile memory storage module and identifying a set of soft-decision reference voltages for each of a plurality of soft-decision reference voltage partitioning values. Based upon the estimated BER and the plurality of soft-decision reference voltage partitioning values, the method further includes, calculating a LLR (log likelihood ratio) introduced error value for each set of soft-decision reference voltages based upon the identified BER of the nonvolatile memory storage module and identifying the set of soft-decision reference voltages having the smallest calculated LLR introduced error value. Wherein the LLR introduced error value for each set of soft-decision reference voltages represents the error introduced by the computation of the LLR for each set of soft-decision reference voltages. After the set of soft-decision reference voltages having the smallest calculated LLR introduced error value have been identified, the method further includes, reading an LDPC encoded codeword stored in the nonvolatile memory storage module using the soft-decision reference voltages having the smallest calculated LLR introduced error value to provide a plurality of soft-decision bits representative of the codeword, accessing an LLR look-up table for the nonvolatile memory storage module to extract the LLRs from the LLR look-up table for each of the soft-decision bits and providing the extracted LLRs to an LDPC decoder for decoding of the codeword.

In a particular embodiment, the LLR (log likelihood ratio) introduced error value for each set of soft-decision reference voltages based upon the identified BER of the nonvolatile memory storage module is calculated using Lloyd's algorithm or Voronoi iteration for each set of soft-decision reference voltages.

A nonvolatile memory storage module controller for providing log likelihood ratios (LLRs) for LDPC decoding includes, partitioning circuitry configured to identify a bit-error-rate (BER) for the nonvolatile memory storage module, to identify a set of soft-decision reference voltages for each of a plurality of soft-decision reference voltage partitioning values, to calculate the introduced error value for each set of soft-decision reference voltages based upon the identified BER of the nonvolatile memory storage module and to identify the set of soft-decision reference voltages having the smallest calculated introduced error value. The nonvolatile memory storage module controller further includes an LLR look-up table and read circuitry. The read circuitry is configured to read an LDPC encoded codeword stored in a nonvolatile memory storage module using the set of soft-decision reference voltages having the smallest calculated introduced error value and to identify a plurality of soft-decision bits representative of the codeword. The read circuitry is further configures to extract the LLRs from the LLR look-up table for the set of soft-decision bits having the smallest calculated introduced error value and to provide the extracted LLRs to an LDPC decoder for decoding of the codeword.

In a specific embodiment, the partitioning circuitry is configured to calculate the introduced error value using Lloyd's algorithm or Voronoi iteration for each set of soft-decision reference voltages.

In accordance with the present invention, the introduced error value for an estimated BER of a nonvolatile memory storage module is computed and a set of soft-decision reference voltages are selected to perform the soft-decision reads that minimizes the error value introduced into the LDPC decoding process. As such, the most accurate LLR values are provided to LDPC decoder. Providing the most accurate LLR values to the LDPC decoder improves the reliability of the nonvolatile memory system by preventing the selection of soft-decision reference voltages that would lead to inaccurate LLR values being provided to the LDPC, resulting in a read failure. Additionally, providing the most accurate LLR values to the LDPC decoder improves the speed of the nonvolatile memory system by insuring that the minimum number of iterations are performed during the decoding process. Selecting of the most accurate LLR values based upon the proper selection of the soft-decision reference voltages for LDPC decoding increases both the lifetime of the memory storage module and the decoding speed.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1A:
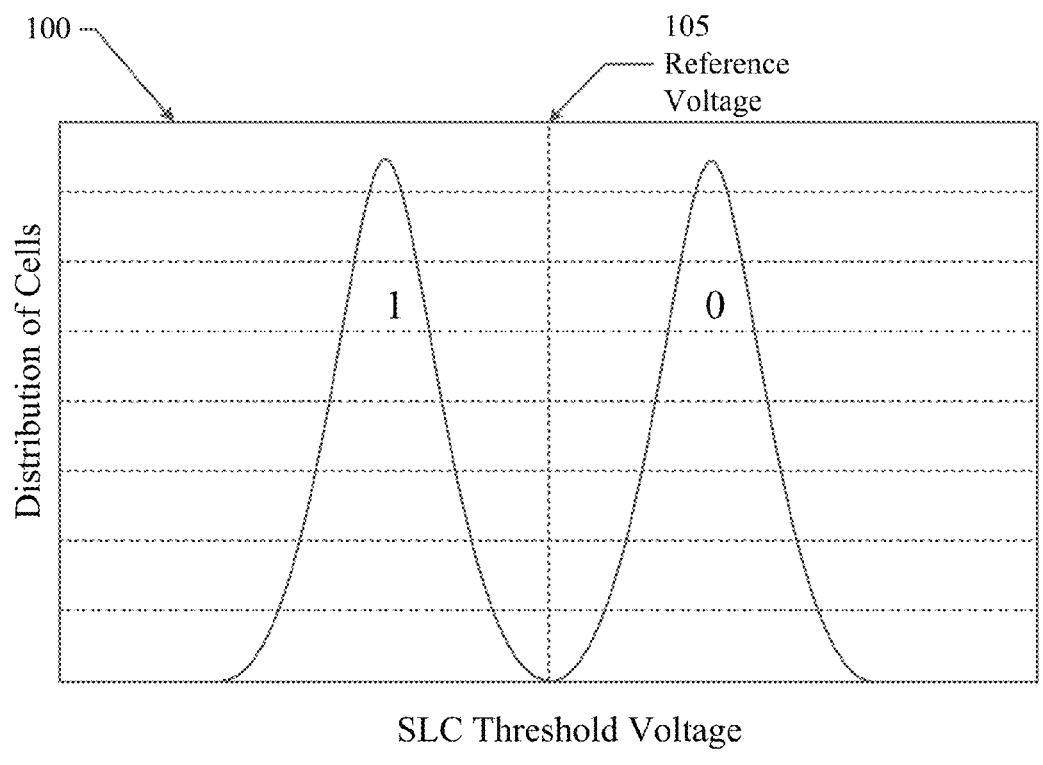
FIG. 1A is a graphical illustration of a possible threshold voltage distribution for a single-level cell at the beginning of its lifetime in accordance with an embodiment of the invention.

In the operation of a stored channel utilizing LDPC encoding, original data are stored in a non-volatile memory, such as a NAND-based flash memory. Different noise sources estimated as White Gaussian Noise (AWGN) Channel corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

The nonvolatile memory system used in the communication system may be a NAND-based flash memory system. While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm)

is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

The bit error rate (BER) of the flash memory changes over the lifetime of the device. It is well known that NAND flash memory program/erase (P/E) cycling gradually degrades the storage reliability of the memory device. Flash memory P/E cycling causes damage to the tunnel oxide of the floating gate transistors in the form of charge trapping in the oxide and interface states. This charge trapping directly results in a shifting of the threshold voltage and gradually degrades the memory device noise margin. Additionally, the BER may change over the lifetime of the flash memory due to a decrease in retention time resulting from the P/E cycling of the device.

Each NAND storage element can store one, or multiple, bits of data. In the case of a single-level cell (SLC), the NAND storage element is designed to store one bit of data. The graph 100 of FIG. 1A illustrates a typical SLC threshold voltage distribution for a distribution of flash cells. As illustrated in the graph 100 of FIG. 1A, the range of possible threshold voltages of the SLC NAND cells is divided into two ranges, wherein one range is designated as representative of a logical "1" and the other range is designated as representative of a logical "0". The two ranges are separated by the reference voltage 105. In a particular example, the value of the reference voltage 105 may be zero and the threshold voltage of the cell is negative after the cell is erased and is defined as a logical "1".

Figure 1B:
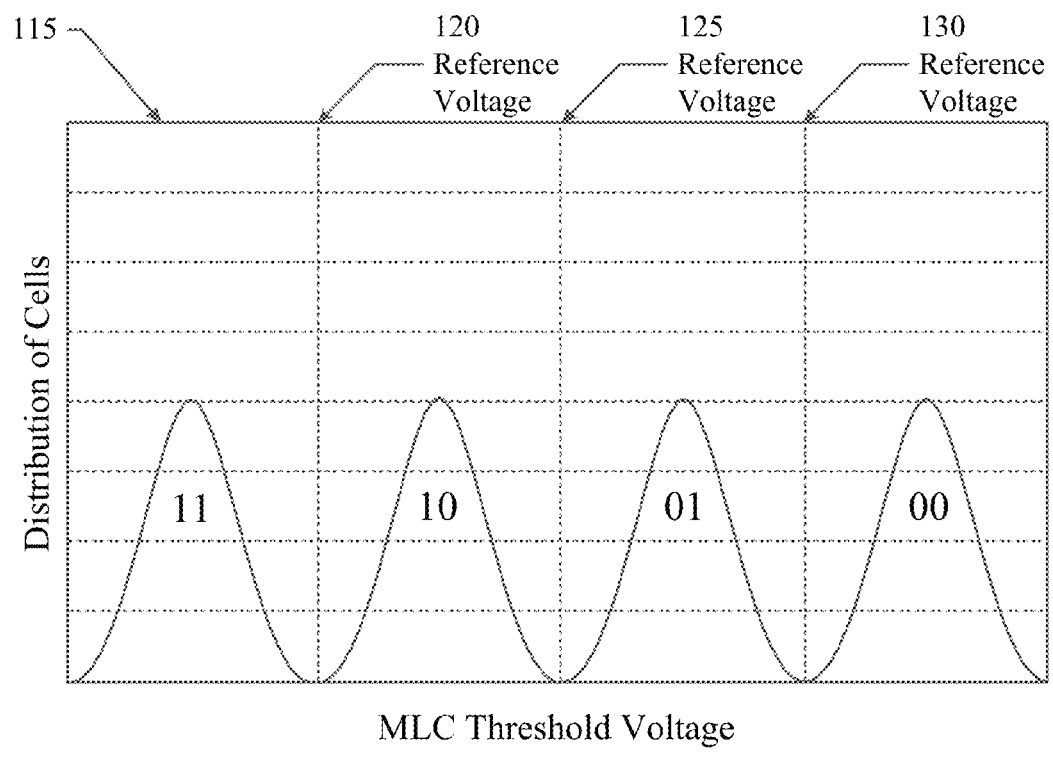
FIG. 1B is a graphical illustration of a possible threshold voltage distribution for a multi-level cell at the beginning of its lifetime in accordance with an embodiment of the invention.

In the case of an n-bit multi-level cell (MLC) NAND flash memory, the threshold voltage of each cell can be programmed to $2^n$ separate states. The graph 115 of FIG. 1B illustrates a typical MLC threshold voltage distribution for a distribution of flash cells. In the illustrated case of a 2-bit MLC, each of the possible states of the cell, "11", "10", "01" and "00", corresponds to a non-overlapping threshold voltage range, as illustrated in the graph 115 of FIG. 1B. The ranges are bounded by the reference voltages 120, 125 and 130. In a particular example, the value of the reference voltage 120 may be zero and the smallest threshold voltage of the cell "11" may indicate and erased state with the remaining threshold voltages "10", "01", and "00" indicating a programmed state. In a particular embodiment, the NAND flash memory device may be capable of storing 3 bits per cell, and is commonly referred to as a triple level cell (TLC)

FIGS. 1A-1B illustrate the threshold voltage distributions for a typical SLC and MLC flash memory device at the beginning of the device lifetime. As is shown, at the beginning of the flash device lifetime, the threshold voltage distributions do not overlap and are symmetrical about the reference voltage(s). However, during the lifetime of the flash memory, the threshold voltage distributions may become distorted or shifted as a result of P/E cycling and loss of charge over time. While MLCs can store more data, the lifetime of MLCs tends to be considerably shorter than that of SLCs because there is much less separation between the levels of charge that represent the states in the MLCs and as such, they more quickly lose their ability to successfully store varying levels of voltage. As a result of the shift in the voltage distributions over the lifetime of both the SLC and MLC devices, the previously non-overlapping threshold voltage ranges may begin to overlap as illustrated with reference to FIG. 2. This overlap results in memory read errors which may be corrected utilizing LDPC encoding and decoding techniques.

The power of LDPC codes resides in the ability of the decoding strategy to exploit the soft information of the stored data. In LDPC decoding of single-level (SLC) flash memory, the two voltage distributions represent the two possible states, "0" and "1", of the cells within the NAND chips. When the voltage distributions overlap 210, as shown with reference to the graph 200 of FIG. 2, errors arise. A hard-decision decoder will read all the values to the right of the reference voltage 205 as 0 and all the values to the left of the reference voltage 205 as 1. So, in the situation depicted in the graph 200, the overlap region 210 will be composed of read errors. However, observing error points A and B within the overlap region 205, it is clear that the error points may vary in magnitude. The farther away the error points are from the reference voltage 205, the more probable it is that the cell contains the value that was stored. For example, point A is slightly to the right of the reference voltage and as such, slightly positive, while point B is farther away from the reference voltage 205. As such, it is more likely that point A carries the greater error because correct values should not be close to the reference voltage. Alternatively, point B is considered to carry less error than point A and is more likely to be read correctly. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). As such, in FIG. 2, error point A would be presented to the LDPC decoder as a value of zero and assigned a low magnitude LLR (probability) due to its close proximity to the reference voltage 205, whereas error point B would be presented to the LDPC decoder as a value of zero and assigned a moderate magnitude LLR (probability) due to its greater distance from the reference voltage 205. The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the log likelihood ratio (LLR) of the received data bits in the codeword, as in the equation:

$$LLR(x) = \log\left[\frac{p(x \mid y = 0)}{p(x \mid y = 1)}\right] \quad (1)$$

where "y" is the read message and "x" is the original codeword. As such, the LLR for a particular read value of "y" is the logarithmic ratio between the probability that the bit of the original codeword "x" was a 0 given the read value "y" and the probability that the bit "x" was a 1 given the read value "y". As such, the magnitude of the LLRs measure the probability that the bit is read correctly vs. the probability that the bit is read incorrectly. When performing decoding of the codeword, the LLRs are propagated and updated between the variable nodes and the check nodes in a Tanner graph, which is representative of the parity check matrix of the LDPC code.

Figure 2:
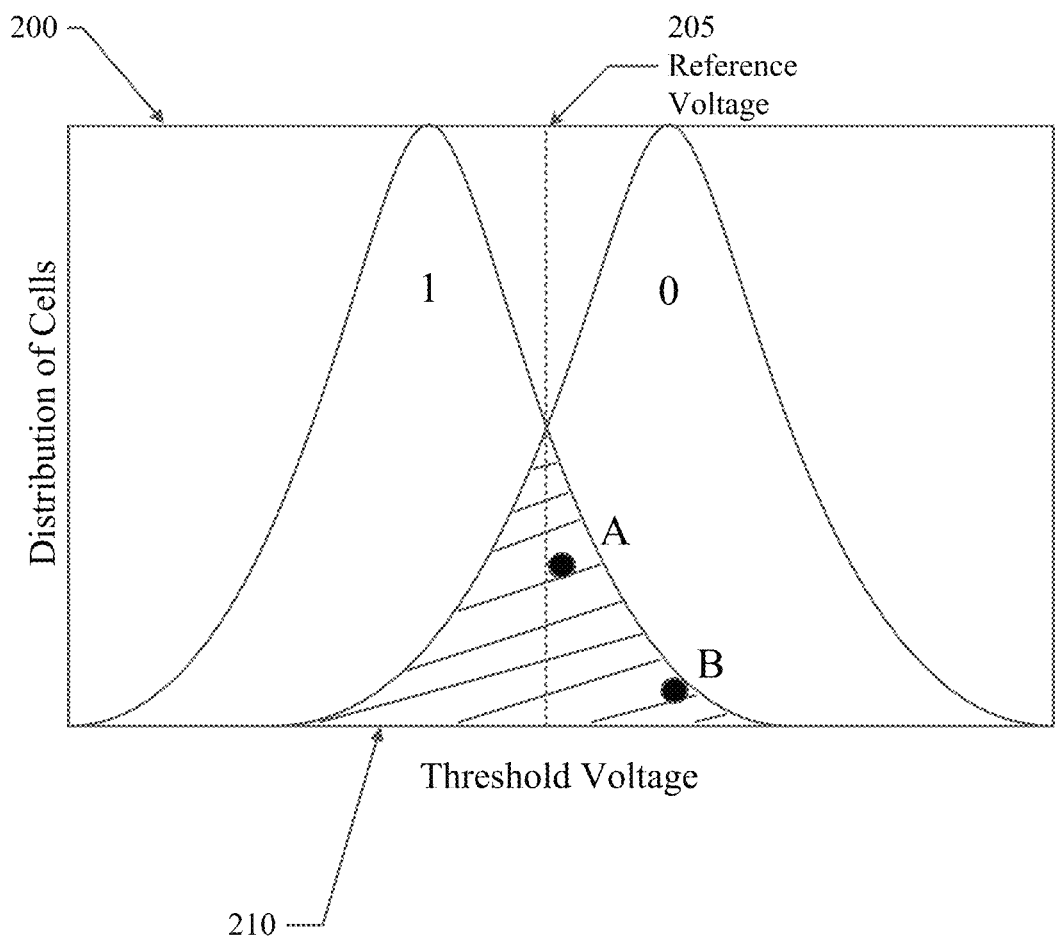
FIG. 2 is a graphical illustration of an overlapping threshold voltage distribution in a single-level cell in accordance with an embodiment of the invention.

The threshold voltage distribution overlap illustrated in FIG. 2 will occur if both the erase distribution and programmed distributions widen and shift substantially symmetrically such that the overlap 210 is equally distributed around the reference voltage 205. To perform a successful read operation on the NAND-based flash memory device employing LDPC encoding, a plurality of read operations are performed at various read reference voltage levels, often referred to as soft-decision reference voltages. The read reference voltage is applied to the corresponding control gate of the cell to see if the sensed cell conducts at that particular read reference voltage. The responses of the cell for each of the read reference voltages are then used to determine the value of the bit stored by the cell. The conventional design practice is to employ uniform distribution for sensing the cells, wherein the soft-decision reference voltages are uniformly distributed between two consecutive hard-decision reference voltages. However, the voltage threshold distribution is dependent upon the BER and when the BER results in a large overlap, as shown in FIG. 2, the entire overlap area needs to be included in the range of the soft-decision reference voltages, otherwise LLR values will be estimated very well near 0V, but larger errors will be introduced at the border of the overlap area. The error committed on the LLR as a result of less than the best possible soft-decision reference voltage locations has a strong negative affect on the LDPC decoding performance because a very larger error translates into an inaccurate input into the LDPC decoder from the LLR look-up table. As such, by partitioning the threshold voltage distribution to identify the best set of soft-decision reference voltages to read the cell, better information for determining the bit value can be provided to the LDPC decoder.

Figure 3:
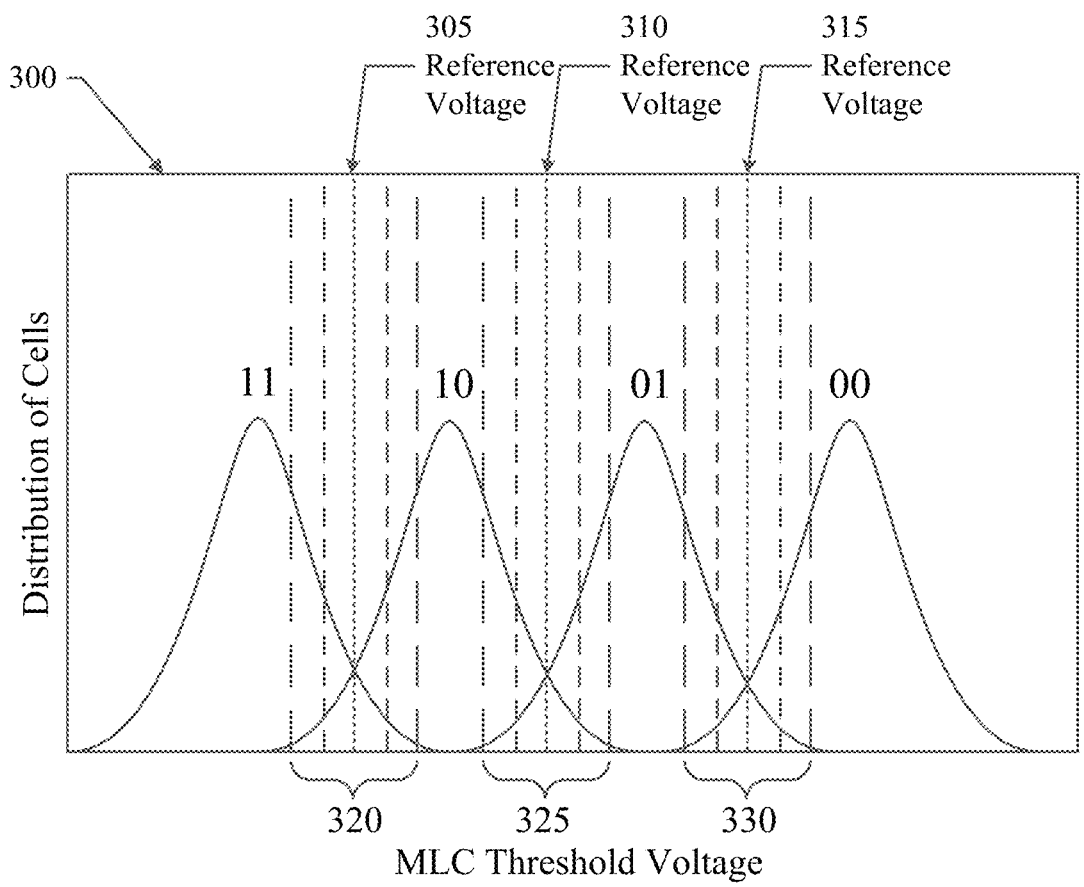
FIG. 3 is a graphical illustration of an overlapping threshold voltage distribution in a multi-level cell in accordance with an embodiment of the invention.

As shown with reference to FIG. 3, in accordance with an embodiment of the present invention, soft-decision reference voltage sensing is performed for an MLC cell, wherein the overlap regions 320, 325 and 330 are defined around each of the hard-decision reference voltages 305, 310 and 315 and memory sensing is performed within each of the overlap regions using the plurality of soft-decision reference voltages. In the case of an MLC flash memory, the overlap regions of the threshold voltage distributions for the flash memory cells are divided into a number of partitions, on either side of the hard-decision reference voltage, by moving the read reference voltages. In order to locate each bit without error, more read operations at these soft-decision reference voltages are required. As shown in the graph 300 of FIG. 3, in a specific embodiment, each overlap region 320, 325 and 330 is divided into four partitions, so that each bit (LSB and MSB) is read utilizing 3 bits, where 3 represents the number of soft-decision bits.

As previously described, for LDPC decoding, the log likelihood ratio (LLR) of the received data bits in the codeword is used to decode the codeword. As such, after each bit position is measured and the 3-bit soft-decision data has been identified, the proper LLR associated with the soft-decision bits is extracted from a look-up table stored in the flash controller and the LLR is then fed to the LDPC decoder for subsequent decoding of the codeword. In the exemplary embodiment shown in FIG. 3, 3 soft-decision bits are used to identify eight regions, therefore eight LLRs will be extracted from the look-up table to perform the LDPC decoding process. Additionally, every overlap region requires an LLR look-up table, so that in the MLC case illustrated in FIG. 3, three LLR look-up tables are needed to provide the necessary decoding information.

LLRs are a function of the shape and location of the threshold voltage distribution for the flash cells and can be computed or measured in a characterization laboratory. The LLR values read from the LLR tables depend upon the soft-decision reference voltage locations used to read the encoded data from the nonvolatile memory. The selection of the soft-decision reference voltages introduces an error into the LDPC decoding as a result of the approximation of the LLR value. It is desirable to reduce the error introduced by the approximation of the LLR values, thereby improving the LDPC performance. The approximation error can be reduced by identifying the best partitioning for the threshold voltage distribution, thereby identifying the best set of soft-decision reference voltages to read the encoded data.

In the present invention, an LLR look-up table need not be a physical entity, but may be considered in a broader sense to be a logical entity.

Figure 4:
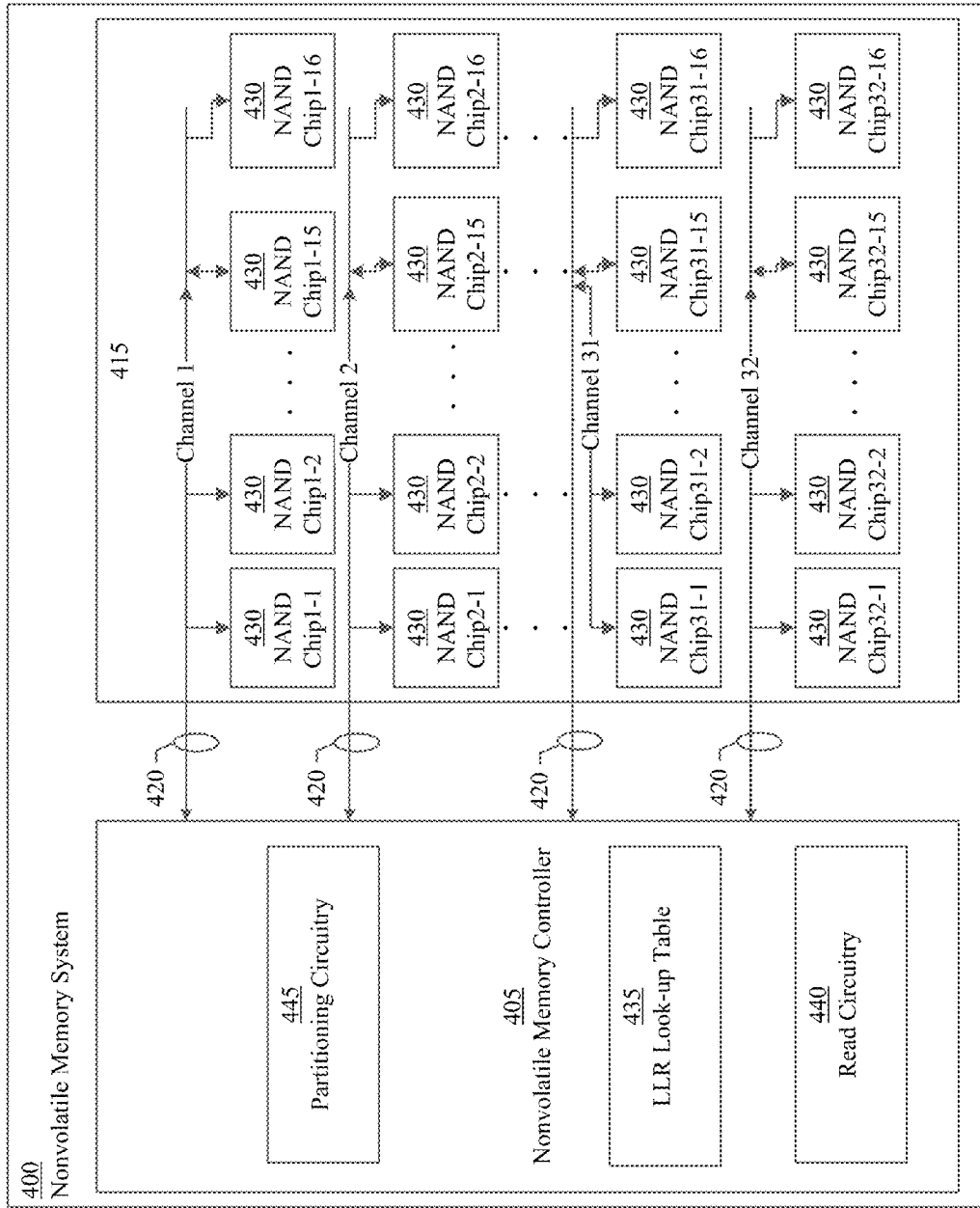
FIG. 4 is a graphical illustration of the error value introduced into the LLR value relative to the soft-decision reference voltage partitioning value in accordance with an embodiment of the invention.

As shown with reference to FIG. 4, a nonvolatile memory system 400, such as a solid state drive, may include a nonvolatile memory storage module 415 and a nonvolatile memory controller 405. The nonvolatile memory storage module 415 may comprise a plurality of NAND chips 430. Each of the plurality of NAND chips 430 may be coupled to the nonvolatile memory controller 405 through a plurality of channels 420. In this embodiment, the NAND chips 430 store the encoded codewords and the memory controller 405 is designed to execute reading and writing controls for the NAND chips 430 according to reading and writing instructions received from an access device. The nonvolatile memory controller 405 further includes a LLR look-up table 435 representative of the threshold voltage distribution of the memory storage module 415.

The nonvolatile memory controller 405 further comprises partitioning circuitry 445. The partitioning circuitry 445 identifies a set of soft-decision reference voltages that will minimize the LLR introduced error value, given a specific bit-error-rate (BER) for the nonvolatile memory storage module 415. The partitioning circuitry 445 identifies a set of soft-decision reference voltages for each of a plurality of soft-decision reference voltage partitioning values. The soft-decision reference voltage partitioning values may be predetermined and provided to the partitioning circuitry 445. In one embodiment the soft-decision reference voltage partitioning values are input by the nonvolatile memory system manufacturer and are stored in nonvolatile memory system

400. In another embodiment the soft-decision reference voltage partitioning values are selectable, with a number of predetermined soft-decision reference voltage partitioning values available for selection by the nonvolatile memory system manufacturer. In one particular embodiment, soft-decision reference voltage partitioning values of 25mV, 50mV, 100mV, 150mV, 200mV and 250mV can be selected, with the option of selecting some or all of the predetermined soft-decision reference values that are available for selection. The partitioning circuitry 445 calculates a LLR (log likelihood ratio) introduced error value for each set of soft-decision reference voltages based upon the identified BER of the nonvolatile memory storage module 415 to identify the set of soft-decision reference voltages having the smallest calculated LLR introduced error value.

To identify the set of soft-decision reference voltages having the smallest calculated LLR introduced error value, the partitioning circuitry 445 first determines a number of reads of the LDPC encoded codeword to be performed using the soft-decision reference voltages. In one embodiment the number of reads to be performed is selectable by the nonvolatile memory system manufacturer. In a particular embodiment, the number of reads is dependent upon the BER of the nonvolatile memory storage module 415. In general, an increasing number of reads of the LDPC encoded codeword improves the strength of correction. However, it is desirable to limit the number of reads only to the number of reads necessary to provide the desired error correction while maintaining the lowest possible real-time latency.

The partitioning circuitry 445 then selects one of the plurality of soft-decision voltage partitioning values and partitions the threshold voltage distribution associated with the BER of the nonvolatile memory storage module to identify the set of soft-decision reference voltages for the selected soft-decision reference voltage partitioning value. The partitioning circuitry 445 then calculates the LLR introduced error value for each set of soft-decision reference voltages for each of the selected soft-decision voltage partitioning values. In one embodiment, Lloyd's algorithm or Voronoi iteration is used to calculate the LLR introduced error value for each set of soft-decision reference voltages.

In a specific embodiment, the LLR introduced error value resulting from the selection of a specific set of soft-decision reference voltages can be computed in accordance with Lloyd's algorithm:

$$\text{err} = \Sigma_n \int_{x_n}^{x_{n+1}} \text{LLR}(x) * (\text{LLR}(x) - \text{LLR}_n)^2 dx \tag{2}$$

Where, LLR(x) is computed according to equation (1) and $\text{LLR}_n$ is the estimated LLR value based on the soft-decision reference voltage location (n).

After the LLR introduced error values are calculated for each set of soft-decision reference voltages, the set of soft-decision reference voltages having the smallest calculated LLR introduced error are used to read the LDPC encoded codeword.

The nonvolatile memory controller 405 further comprises read circuitry 440 for reading the codewords stored in the nonvolatile memory storage module 415. The partitioning circuitry 445 provides the set of soft-decision reference voltages having the smallest calculated LLR introduce error value to the read circuitry 440 of the nonvolatile memory module 415. The read circuitry 440 is configured to read an LDPC encoded codeword stored in the nonvolatile memory storage module 415 using the set of soft-decision reference voltages having the smallest calculated LLR introduced error value provided by the partitioning circuitry 445 to identify a plurality of soft-decision bits representative of the codeword.

The plurality of soft-decision bits identified by the read circuitry 440 are then used to access the LLR look-up table 435 associated with the nonvolatile memory storage module 415 to extract the LLRs from the look-up table 435 for each of the soft-decision bits. The extracted LLRs are then provided to an LDPC decoder for decoding of the codeword.

Figure 5:
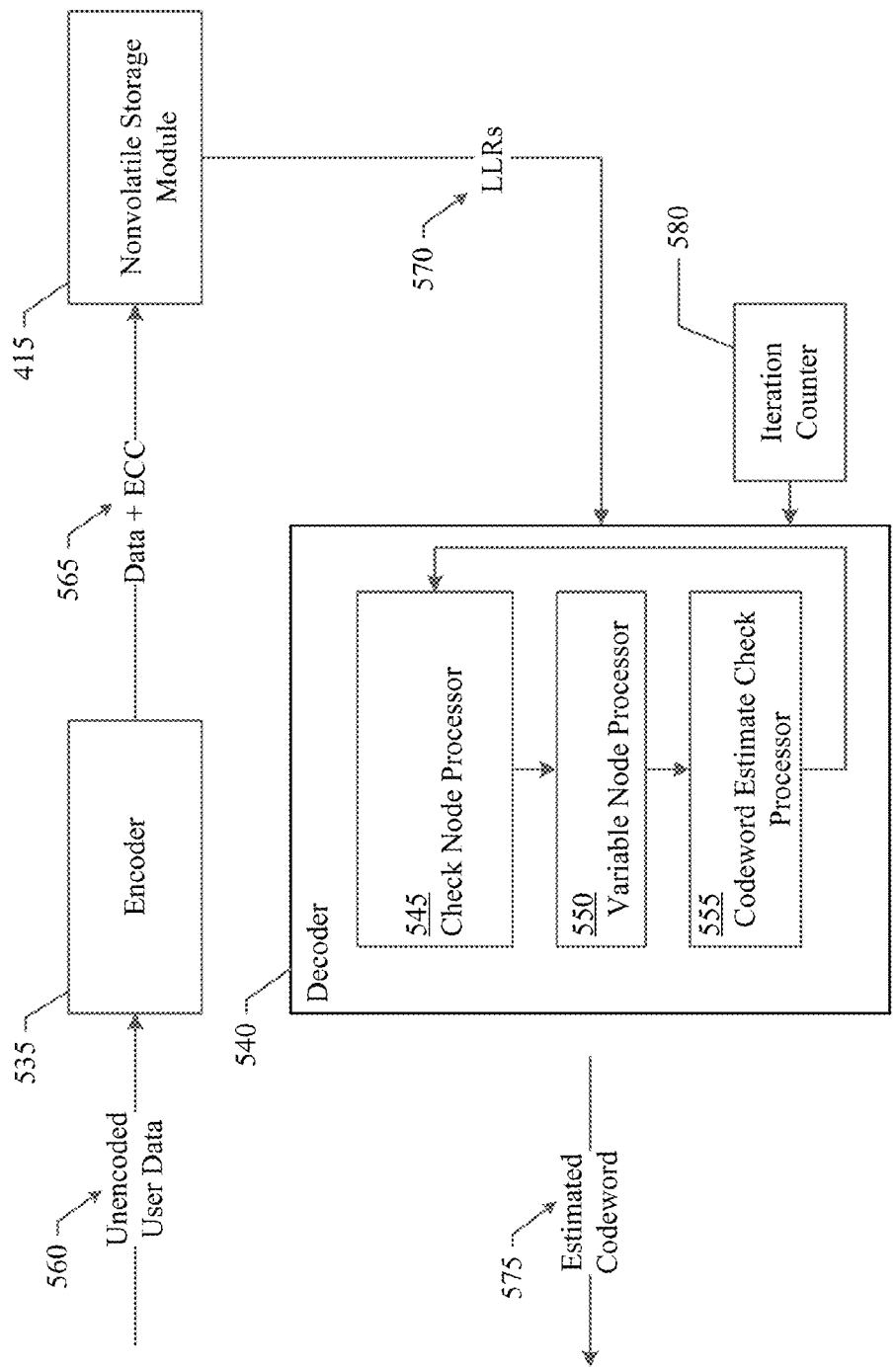
FIG. 5 is a graphical illustration of the average iterations performed by an LDPC code relative to the soft-decision reference voltage partitioning value in accordance with an embodiment of the invention.

The nonvolatile memory storage module 415 of FIG. 4 may be incorporated into a LDPC system as shown with reference to FIG. 5. As shown, the LDPC system may comprise an encoder 535 that is responsible for adding the parity bits to the unencoded user data 560 in accordance with a low-density parity check (LDPC) code. The LDPC encoded data 565, which includes the unencoded user data 560 and an error correction code, may then be stored as encoded codewords in the nonvolatile memory storage module 415. In a particular embodiment the nonvolatile memory storage module 415 may include a plurality of NAND chips 430. The nonvolatile memory storage module 415 and a nonvolatile memory controller 405 and a LLR look-up table 435 may be stored in a nonvolatile memory system 400 as previously described with reference to FIG. 4. During a read operation of the nonvolatile memory storage module 415, multiple reads of the stored codewords are executed to provide soft-decision information represented by the LLRs 570 extracted from the LLR look-up table 435 associated with the nonvolatile memory storage module 415. The LLRs 570 are used as input to the LDPC decoder 540 to decode the unencoded user message data 560 encoded by the encoder 535, utilizing LDPC coding following a parity check matrix (H). The received LLR values for each variable node are taken as the initial variable node messages. The check node processor 545 updates the check nodes of a first layer with the variable node messages to which they are connected. The resulting messages of the check node processor 545 are then passed to the variable node processor 550 and the variable node processor 550 then updates each variable node with the check node messages to which they are connected. The iterative decoding process continues, as is known in the art, and the resulting codeword estimate is then checked by a codeword estimate check processor 555, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is a valid codeword, the decoding is complete and the estimated codeword is provided as output 575 from the decoder 540. If it is determined by the codeword estimate check processor 555 that the codeword estimate is not a valid codeword, a second iteration of the decoding begins. The iteration counter 580 may be used to track the number of iterations of the decoding process and may cause the decoding to terminate if a maximum number of iterations is reached.

In a particular embodiment of the present invention, LDPC decoding of the codeword is performed based upon a parity check matrix. The parity check matrix consists of "0"s and "1"s defining the parity check equations. For an "M" row× "N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix.

In a specific embodiment, a nonvolatile memory storage module 415 having a BER of $10^{-2}$ storing an encoded codeword is to be read by the read circuitry 540. Prior to the performance of the read by the read circuitry of decoder 540, the partitioning circuitry 445 identifies a set of soft-decision reference voltages to be used to access the LLR look-up table associated with the BER. In this embodiment, seven reads are to be used and the partitioning circuitry 445 identifies the set of seven soft-decision reference voltages by calculating the LLR introduced error value for each set of seven soft-decision reference voltages for each of a plurality of reference voltage partitioning values. In one embodiment, a first reference voltage partitioning value is 50mV and a second reference voltage partitioning value is 200mV. The partitioning circuitry 445 partitions the voltage threshold distribution associated with the BER at 50mV and then calculates the LLR introduced error value with a 50mV partition using Lloyd's algorithm. The partitioning circuitry 445 then partitions the voltage threshold distribution associated with the BER at 200mV and calculates the LLR introduced error value with a 200mV partition using Lloyd's algorithm. The partitioning circuitry 445 then compares these two LLR introduced error values to identify the set of seven soft-decision reference voltages having the smallest calculated LLR introduced error value.

Figure 6:
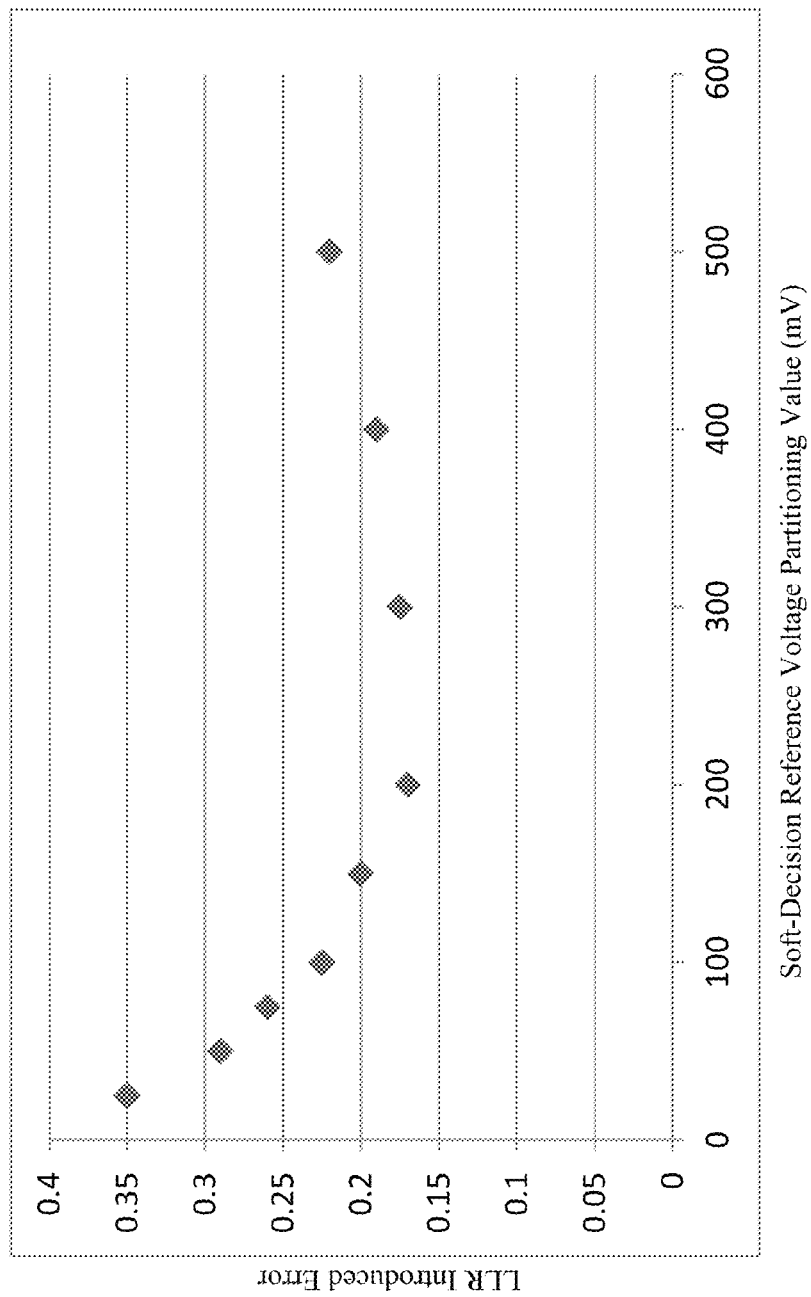
FIG. 6 is a block diagram illustrating a nonvolatile memory system in accordance with an embodiment of the present invention.

FIG. 6 illustrates the LLR introduced error value for a plurality of soft-decision threshold voltage partitioning values, given that the BER of the nonvolatile memory storage module is $10^{-2}$. As shown in FIG. 6, the LLR introduced error value is much larger when the soft-decision reference voltage partitioning value is 50mV, as compared to the LLR introduced error value when the soft-decision reference voltage partitioning value is 200. In the particular embodiment wherein seven reads of the encoded data are performed, the LLR introduced error value for soft-decision reference voltages of −150mV, −100mV, −50mV, 0mV, 50mV, 100mV, 150mV soft-decision reference voltage partitioning value is much larger than the LLR introduced error value for soft-decision reference voltage of −600mV, −400mV, −200mV, 0V, 200mV, 400mV, 600mV (200mV soft-decision reference voltage partitioning value). As such, at a BER of $10^{-2}$, the threshold voltage distribution is more accurately read when the LLR introduced error value is the smallest, which is accomplished by setting the soft-decision reference voltages to be separated by 200mV. As illustrated in the graph of FIG. 6, various other reference voltage partitioning values may be selected (i.e. 100mV, 300mV). The soft-decision reference voltage partitioning values may be selectable by a user of the system or alternatively, preprogrammed into the partitioning circuitry 445. The selection of the soft-decision reference voltage partitioning values affects the error correction capability of the LDPC code. The error correction required is dependent upon the BER and the associated probability distribution of the nonvolatile memory storage module. The error correction capability of LDPC decoding gradually improves as the soft-decision reference voltage partitioning value is reduced and the soft-decision reference voltages are spaced more closely together. However, increasing the number of soft-decision reference voltages and the number of associated reads undesirably increases the read latency and overhead of the nonvolatile memory storage module. Accordingly, there is a trade-off between the number of soft-decision reference voltage reads performed and the desired read latency of the nonvolatile memory storage module.

Additionally, the NAND flash memory cell raw storage reliability gradually degrades during the lifetime of the memory cells. The degradation in reliability requires that a stronger LDPC error correction code be used to recover the stored data. A stronger LDPC code often utilizes a larger number of reads of the data utilizing a larger number of soft-decision reference voltages separated by a smaller reference voltage partitioning value. As such, the reference voltage partitioning value and the associated soft-decision reference voltages may change during the lifetime of the nonvolatile memory storage module 415.

Figure 7:
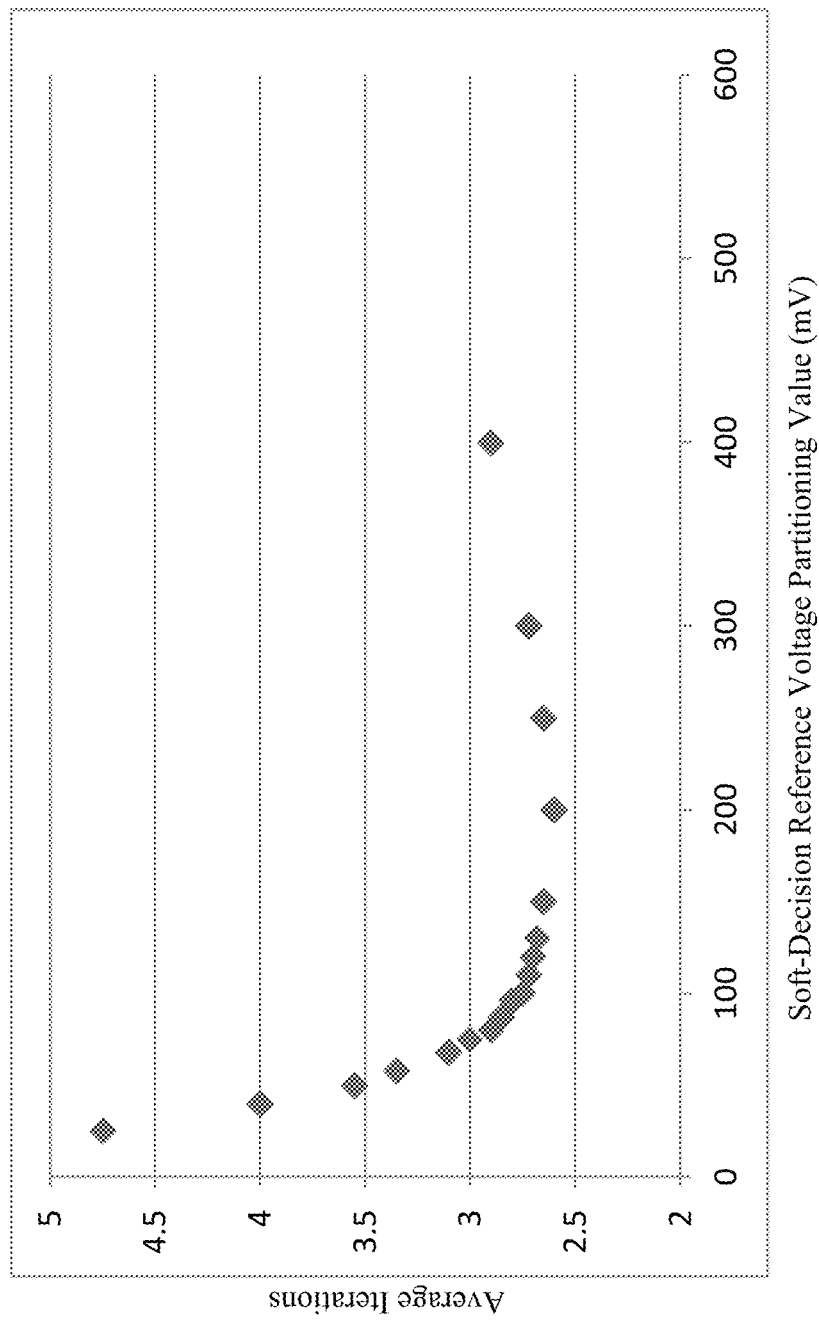
FIG. 7 is a block diagram illustrating LDPC encoding and LDPC decoding in accordance with an embodiment of the present invention.

The set of soft-decision references voltages identified by the partitioning circuitry 445 also has an effect on the number of iterations required to perform the LDPC decoding. It is desirable to reduce the number of required iterations, thereby increasing the speed of the decoding process. As shown in FIG. 7, the average number of iterations performed by an LDPC code varies as the set of soft-decision reference voltages changes, and as so the corresponding LLR values change. In a particular embodiment, the LDPC code used is a QC-LDPC (quasi-cyclic low density parity check) code and the decoding algorithm is a normalized layered MN-SUM, although this is not meant to be limiting and various other LDPC codes and decoding techniques are within the scope of the present invention. As shown in FIG. 7, the minimum number of iterations is achieved at a reference voltage partitioning value of around 200. This result corresponds to the smallest LLR introduced error value illustrated in FIG. 6. As such, using a set of soft-decision reference voltages having the smallest LLR introduced error value results in the minimum number of iterations for the LDPC decoding because the quality of the LLR inputs to the decoder are better with a soft-decision reference voltage partitioning value of 200mV than with a soft-decision reference voltage partitioning value of 50mV.

Figure 8:
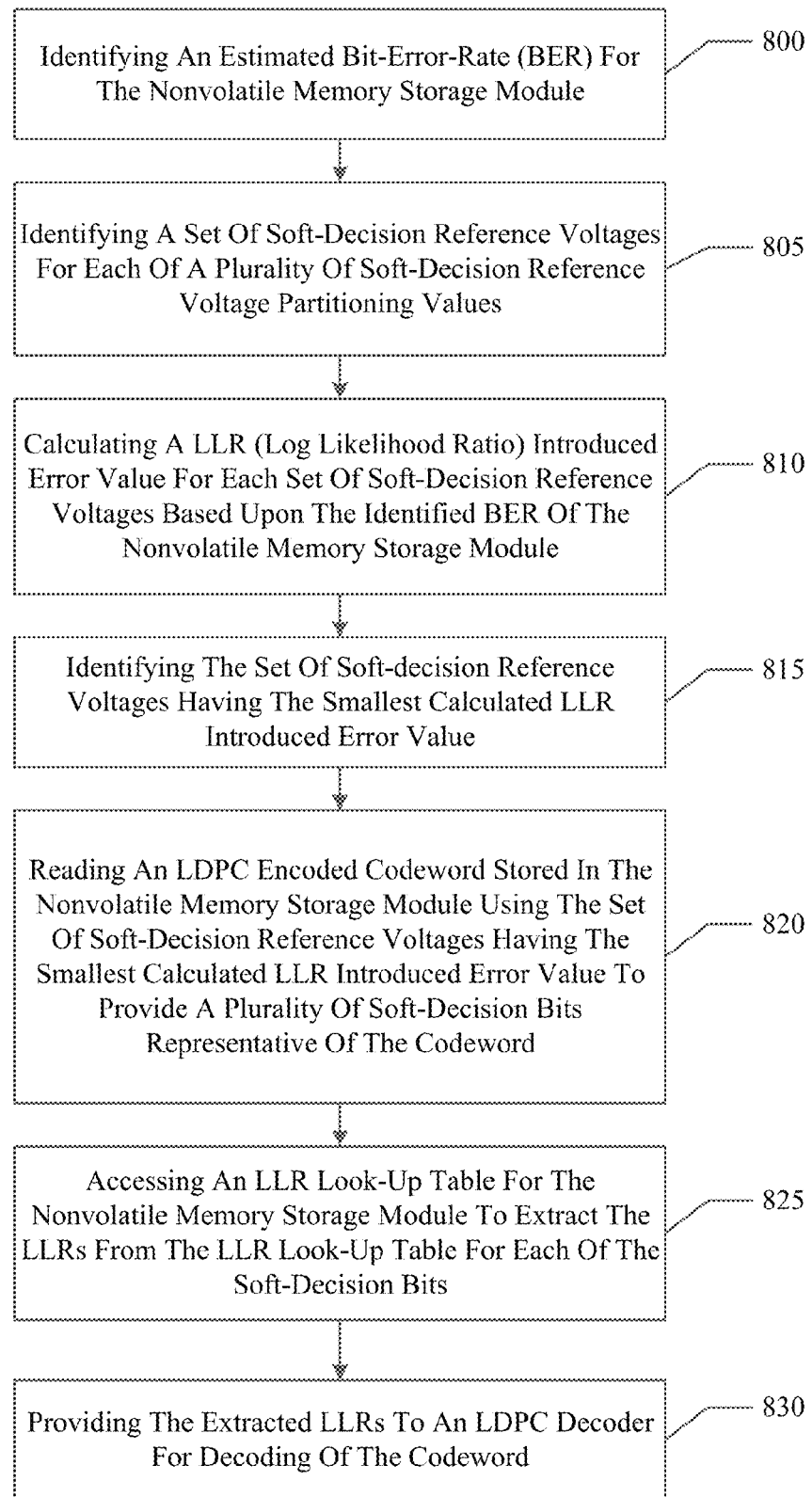
FIG. 8 is a flow diagram illustrating the LDPC decoding method in accordance with an embodiment of the present invention.

With reference to FIG. 8, in operation of the present invention, a method of providing log likelihood ratios (LLRs) to a low-density parity check (LDPC) decoder in a nonvolatile memory storage module includes identifying an estimated bit-error-rate (BER) for the nonvolatile memory storage module 800. As is known in the art, the BER may be computed or measured in a characterization laboratory and may change during the lifetime of the device. In one embodiment the BER is input by the nonvolatile memory system manufacturer and is stored in nonvolatile memory system 400. In this embodiment, identifying the BER comprises reading the stored BER from nonvolatile memory system 400.

After the BER for the nonvolatile memory storage module has been identified, the method further includes, identifying a set of soft-decision reference voltages for each of a plurality of soft-decision reference voltage partitioning values 805. The plurality of soft-decision reference voltage partitioning values may be selected based upon a desired number of reads of the nonvolatile memory storage module and the BER of the nonvolatile memory storage module 415. In general, the set of soft-decision reference voltages is determined by evenly distributing the soft-decision reference voltages and centered at the reference voltage of the FLASH cell, wherein the soft-decision reference voltages are separated from each other by a distance equal to a selected soft-decision reference partitioning value. A set of soft-decision reference voltages are identified for each of the plurality of soft-decision reference voltage partitioning values. Identifying a set of soft-decision reference voltages for each of a plurality of soft-decision reference voltage partitioning values may further include determining a number of reads of the LDPC encoded codeword to be performed using the soft-decision reference voltages, selecting one of the plurality of soft-decision voltage partitioning values and partitioning a threshold voltage distribution associated with the BER of the nonvolatile memory storage module based upon the selected soft-decision reference voltage partitioning value and the number of reads to identify the set of soft-decision reference voltages. In a particular embodiment, the partitioning circuitry 445 of the nonvolatile memory system 400 is configured for identifying an estimated bit-error-rate (BER) for the nonvolatile memory storage module 805 and for identifying a set of soft-decision reference voltages for each of a plurality of soft-decision reference voltage partitioning values 805.

After the sets of soft-decision reference voltages have been identified, the method continues by calculating a LLR (log likelihood ratio) introduced error value for each set of soft-decision reference voltages based upon the identified BER of the nonvolatile memory storage module 810. Wherein the LLR introduced error value for each set of soft-decision reference voltages represents the error introduced by the computation of the LLR for each set of soft-decision reference voltages. In one embodiment the LLR introduced error value for each set of soft-decision reference voltages may be calculated by summing the calculated LLR introduced error value for each individual soft-decision reference voltage in a particular set of soft-decision reference voltages to obtain the calculated LLR introduced error value for the set of soft-decision reference voltages.

After the LLR introduced error values for each set of soft-decision reference voltages has been determined 810, the set of soft-decision reference voltages having the smallest calculated LLR introduced error value is then identified 815. Using the LLR introduced error value for each set of soft-decision reference voltages, a comparison of the LLR introduced error values for each set of soft-decision reference voltages is performed to determine the set of soft-decision reference voltages having the smallest calculated LLR introduced error value. In a particular embodiment, the LLR introduced error value for each set of soft-decision reference voltages may be calculated using Lloyd's algorithm. In a particular embodiment, the partitioning circuitry 445 of the nonvolatile memory system 400 is configured for calculating a LLR (log likelihood ratio) introduced error value for each set of soft-decision reference voltages based upon the identified BER of the nonvolatile memory storage module 810 and for identifying the set of soft-decision reference voltages having the smallest calculated LLR introduced error value 815.

After the set of soft-decision reference voltages have been determined, the method further includes, reading an LDPC encoded codeword stored in the nonvolatile memory storage module using the set of soft-decision reference voltages having the smallest calculated LLR introduced error value to provide a plurality of soft-decision bits representative of the codeword 820. In a specific embodiment, reading the LDPC encoded codeword using the set of soft-decision reference voltages having the smallest calculated LLR introduced error value maybe performed by the read circuitry 440 of the nonvolatile memory system 400. In a specific embodiment, the read circuitry 440 reads the nonvolatile memory storage module 415 by identifying at least one hard-decision reference voltage in a threshold voltage distribution associated with the nonvolatile memory storage module, partitioning the voltage threshold distribution into a plurality of threshold voltage ranges using the set of soft-decision reference voltages having the smallest calculated LLR introduced error value, applying the set of soft-decision reference voltages to a cell of the nonvolatile memory storage module and sensing a voltage level of the cell.

After the soft-decision bits representative of the codeword have been read from the nonvolatile memory storage module 415 using the read circuitry 440, the method further includes accessing an LLR look-up table for the nonvolatile memory storage module to extract the LLRs from the LLR look-up table for each of the soft-decision bits 825 and providing the extracted LLRs to an LDPC decoder for decoding of the codeword 830. In a specific embodiment, the LLR look-up table 435 is accessed by the read circuitry 440 of the nonvolatile memory controller 405 to extract the LLRs from the LLR look-up table 435.

In accordance with the present invention, the LLR introduced error value for an estimated BER of a nonvolatile memory storage module is computed and a set of soft-decision reference voltages are selected to perform the soft-decision reads that minimizes the LLR error value introduced into the LDPC decoding process. As such, the most accurate LLR values are provided to LDPC decoder. Providing the most accurate LLR values to the LDPC decoder improves the reliability of the nonvolatile memory system by preventing the selection of soft-decision reference voltages that would lead to inaccurate LLR values being provided to the LDPC, resulting in a read failure. Additionally, providing the most accurate LLR values to the LDPC decoder improves the speed of the nonvolatile memory system by insuring that the minimum number of iterations are performed during the decoding process. Selecting of the most accurate LLR values based upon the proper selection of the soft-decision reference voltages for LDPC decoding increases both the lifetime of the memory storage module and the decoding speed.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of providing log likelihood ratios (LLRs) to a low-density parity check (LDPC) decoder in a nonvolatile memory storage module, the method comprising:
    identifying an estimated bit-error-rate (BER) for the nonvolatile memory storage module;
    identifying a plurality of sets of soft-decision reference voltages, each of the plurality of sets of soft-decision reference voltages comprising a plurality of individual soft-decision reference voltages and each of the individual soft-decision reference voltages in each set of soft-decision reference voltages separated from each other by a distance equal to a selected soft-decision reference voltage partitioning value, wherein the selected soft-decision reference voltage partitioning value is different for each of the plurality of sets of soft-decision reference voltages;
    calculating a LLR (log likelihood ratio) introduced error value for each set of soft-decision reference voltages based upon the identified BER of the nonvolatile memory storage module, wherein the calculated LLR introduced error value represents an error introduced by the computation of the LLR for each set of soft-decision reference voltages;
    comparing the calculated LLR introduced error value for each set of soft-decision reference voltages to identify the set of soft-decision reference voltages having a smallest calculated LLR introduced error value;
    reading an LDPC encoded codeword stored in the nonvolatile memory storage module using the set of soft-decision reference voltages having the smallest calculated LLR introduced error value to provide a plurality of soft-decision bits representative of the codeword;

accessing an LLR look-up table for the nonvolatile memory storage module to extract the LLRs from the LLR look-up table for each of the soft-decision bits; and providing the extracted LLRs to an LDPC decoder for decoding of the codeword.

2. The method of claim 1, wherein the nonvolatile memory storage module is a NAND-based flash memory module and further wherein each of the plurality of sets of soft-decision reference voltages comprise an equal number of individual soft-decision reference voltages.

3. The method of claim 1, wherein the nonvolatile memory storage module is a single-level cell (SLC) memory storage module.

4. The method of claim 1, wherein the nonvolatile memory storage module is a multi-level cell (MLC) memory storage module.

5. The method of claim 1, wherein the nonvolatile memory storage module is a triple-level cell (TLC) memory storage module.

6. The method of claim 1, wherein identifying a plurality of sets of soft-decision reference voltages further comprises:

determining a number of reads of the LDPC encoded codeword to be performed using the soft-decision reference voltages, the number of reads equal to the number of individual soft-decision reference voltages of the sets;

selecting one of the plurality of soft-decision voltage partitioning values; for each of the sets of the plurality of sets; and partitioning a threshold voltage distribution associated with the BER of the nonvolatile memory storage module based upon the selected soft-decision reference voltage partitioning value and the number of reads to identify the set of soft-decision reference voltages.

7. The method of claim 1, wherein calculating a LLR (log likelihood ratio) introduced error value for each set of soft-decision reference voltages based upon the identified BER of the nonvolatile memory storage module further comprises calculating a LLR introduced error value using Lloyd's algorithm or Voronoi iteration for each set of soft-decision reference voltages.

8. The method of claim 1, wherein reading an LDPC encoded codeword stored in the nonvolatile memory storage module further comprises:

identifying at least one hard-decision reference voltage in a threshold voltage distribution associated with the nonvolatile memory storage module;

partitioning the voltage threshold distribution into a plurality of threshold voltage ranges using the set of soft-decision reference voltages having the smallest calculated LLR introduced error value;

applying the set of soft-decision reference voltages to a cell of the nonvolatile memory storage module; and sensing a voltage level of the cell.

9. A nonvolatile memory controller for providing log likelihood ratios (LLRs) for LDPC decoding, the controller comprising:

partitioning circuitry configured to identify a bit-error-rate (BER) for the nonvolatile memory storage module, to identify a plurality of sets of soft-decision reference voltages, each of the plurality of sets of soft decision reference voltage comprising a plurality of the individual soft-decision reference voltages and of the individual soft-decision reference voltages in each set of soft-decision reference voltages separated from each other by a distance equal to a selected soft-decision reference voltage partitioning value, wherein the selected soft-decision reference voltage partitioning value is different for each of the plurality of sets of soft-decision reference voltages, to calculate a LLR (log likelihood ratio) introduced error value for each set of soft-decision reference voltages based upon the identified BER of the nonvolatile memory storage module, wherein the calculated LLR introduced error value represents an error introduced by the computation of the LLR for each set of soft-decision reference voltages and to compare the calculated LLR introduced error value for each set of soft-decision reference voltages to identify the set of soft-decision reference voltages having a smallest calculated LLR introduced error value; and read circuitry to read an LDPC encoded codeword stored in a nonvolatile memory Storage module using the set of soft-decision reference voltages having the smallest calculated LLR introduced error value and to identify a plurality of soft-decision bits representative of the codeword.

10. The controller of claim 9, wherein the nonvolatile memory storage module is a NAND-based flash memory module and further wherein each of the plurality of sets of soft-decision reference voltages comprise an equal number of individual soft-decision reference voltages.

11. The controller of claim 9, wherein the nonvolatile memory storage module is a single-level cell (SLC) memory storage module.

12. The controller of claim 9, wherein the nonvolatile memory storage module is a multi-level cell (MLC) memory storage module.

13. The controller of claim 9, wherein the nonvolatile memory storage module is a triple-level cell (TLC) memory storage module.

14. The controller of claim 9, wherein the partitioning circuitry further comprises circuitry to determine a number reads of the LDPC encoded codeword to be performed using the soft-decision reference voltages, wherein the number of reads is equal to the number of individual soft-decision reference voltages of the sets, to select one of the plurality of soft-decision voltage partitioning values for each of the sets of the plurality of sets and to partition a threshold voltage distribution associated with the BER of the nonvolatile memory storage module based upon the selected voltage partitioning value and the number of reads to identify the set of soft-decision reference voltages.

15. The controller of claim 9, wherein the partitioning circuitry is configured to calculate the LLR introduced error value using Lloyd's algorithm or Voronoi iteration for each set of soft-decision reference voltages.

16. The controller of claim 9, wherein the read circuitry for reading an LDPC encoded codeword stored in a nonvolatile memory storage module using a set of soft-decision reference voltages further comprises circuitry configured to identify at least one hard-decision reference voltage in a threshold voltage distribution associated with the nonvolatile memory storage module, to partition the voltage threshold distribution into a plurality of threshold voltages ranges using the set of soft-decision reference voltage having the smallest calculated LLR introduced error value, to apply the set of soft-decision reference voltages to a cell of the nonvolatile memory storage module and to sense a voltage level of the cell.

17. The controller of claim 9, further comprising an LLR look-up table and the read circuitry further configured to extract the LLRs from the LLR look-up table for the set of soft-decision bits having the smallest calculated LLR introduced error value and to provide the extracted LLRs to an LDPC decoder for decoding of the codeword.

18. A nonvolatile memory controller for providing log likelihood ratios (LLRs) for LDPC decoding, the controller comprising:
partitioning circuitry configured to identify a bit-error-rate (BER) for the nonvolatile memory storage module, to identify a plurality of sets of soft-decision reference voltages each of the plurality of sets of soft-decision reference voltages comprising an equal number of individual soft-decision reference voltages and each of the individual soft-decision reference voltages in each set of soft-decision reference voltages separated from each other by a distance equal to a selected soft-decision reference voltage partitioning value, wherein the selected soft-decision reference voltage partitioning value is different for each of the plurality of sets of soft-decision reference voltages, to calculate a LLR (log likelihood ratio) introduced error value for each set of soft-decision reference voltages based upon the identified BER of the nonvolatile memory storage module , wherein the calculated LLR introduced error value represents an error introduced by the computation of the LLR for each set of soft-decision reference voltages and to compare the calculated LLR introduced error value for each set of soft-decision reference voltages to identify the set of soft-decision reference voltages having a smallest calculated LLR introduced error value;
an LLR look-up table;
read circuitry to read an LDPC encoded codeword stored in a nonvolatile memory storage module using the set of soft-decision reference voltages having the smallest calculated LLR introduced error value and to identify a plurality of soft-decision bits representative of the codeword; and
circuitry to extract the LLRs from the LLR look-up table for the set of soft-decision bits having the smallest calculated LLR introduced error value and to provide the extracted LLRs to an LDPC decoder for decoding of the codeword.

19. The controller of claim 18, wherein the partitioning circuitry is configured to calculate the LLR introduced error value using Lloyd's algorithm or Voronoi iteration for each set of soft-decision reference voltages.

20. The controller of claim 18, wherein the partitioning circuitry further comprises circuitry to determine a number reads of the LDPC encoded codeword to be performed using the soft-decision reference voltages, wherein the number of reads is equal to the number of individual soft-decision reference voltages of the sets, to select one of the plurality of soft-decision voltage partitioning values for each of the sets of the plurality of sets and to partition a threshold voltage distribution associated with the BER of the nonvolatile memory storage module based upon the selected voltage partitioning value and the number of reads to identify the set of soft-decision reference voltages.

* * * * *

UNITED STATES PATENT AND TRADEMARK OFFICE
CERTIFICATE OF CORRECTION

PATENT NO. : 9,235,467 B2
APPLICATION NO. : 14/165135
DATED : January 12, 2016
INVENTOR(S) : Rino Micheloni, Alessia Marelli and Peter Z. Onufryk It is certified that error appears in the above-identified patent and that said Letters Patent is hereby corrected as shown below:

Specification

Column 11 line 29, "200" should read --200mV--.
Column 12 line 15, "MN-SUM" should read --MIN-SUM--.
Column 12 line 20, "200" should read --200mV--.

Signed and Sealed this
Twelfth Day of April, 2016

Michelle K. Lee
*Director of the United States Patent and Trademark Office*